(12) United States Patent
Cho

(10) Patent No.: US 11,138,914 B2
(45) Date of Patent: Oct. 5, 2021

(54) DISPLAY DEVICE INCLUDING A CRACK SENSING LINE

(71) Applicant: Samsung Display Co., Ltd., Yongin-si (KR)

(72) Inventor: Seung-Yeon Cho, Seoul (KR)

(73) Assignee: SAMSUNG DISPLAY CO., LTD., Yongin-gi (KR)

( * ) Notice: Subject to any disclaimer, the term of this patent is extended or adjusted under 35 U.S.C. 154(b) by 776 days.

(21) Appl. No.: 15/001,595

(22) Filed: Jan. 20, 2016

(65) Prior Publication Data

US 2016/0232826 A1 Aug. 11, 2016

(30) Foreign Application Priority Data

Feb. 6, 2015 (KR) .................. 10-2015-0018755

(51) Int. Cl.
*G09G 3/00* (2006.01)
*G09G 3/20* (2006.01)

(52) U.S. Cl.
CPC .............. *G09G 3/006* (2013.01); *G09G 3/20* (2013.01); *G09G 2300/0426* (2013.01); *G09G 2310/0264* (2013.01); *G09G 2330/12* (2013.01)

(58) Field of Classification Search
None
See application file for complete search history.

(56) References Cited

U.S. PATENT DOCUMENTS

| 9,581,841 | B2 | 2/2017 | Yanagisawa |
| 9,653,363 | B2 | 6/2017 | Kwak et al. |
| 10,109,797 | B2 | 10/2018 | Kwak et al. |
| 10,448,755 | B1 | 10/2019 | Kwak et al. |
| 2014/0176844 | A1* | 6/2014 | Yanagisawa .......... G02F 1/1309 349/43 |
| 2014/0240521 | A1* | 8/2014 | Kwak .................. H04N 17/004 348/189 |
| 2016/0172428 | A1* | 6/2016 | Song ................... H01L 27/3276 257/99 |
| 2020/0044155 | A1 | 2/2020 | Kwak et al. |

FOREIGN PATENT DOCUMENTS

| CN | 105374311 | 3/2016 |
| JP | H07-193108 | 7/1995 |
| JP | 2011-253359 A | 12/2011 |
| JP | 2013-011663 A | 1/2013 |
| JP | 2014-021479 | 2/2014 |
| JP | 2014-122974 | 7/2017 |
| KR | 10-2007-0015174 A | 2/2007 |
| KR | 10-2007-0082867 A | 8/2007 |
| KR | 10-2011-0037638 A | 4/2011 |

* cited by examiner

*Primary Examiner* — Amr A Awad
*Assistant Examiner* — Donna V Bocar
(74) *Attorney, Agent, or Firm* — F. Chau & Associates, LLC

(57) ABSTRACT

A display device is disclosed. In one aspect, the display device includes a substrate, a plurality of pixels formed over the substrate and a plurality of signal lines formed over the substrate and connected to the pixels. The signal lines include a plurality of data lines formed over the substrate and a first crack sensing line connected to a first data line. The first crack sensing line is divided into first and second sections and the first section has a width that is greater than that of the second section.

9 Claims, 18 Drawing Sheets

DISPLAY DEVICE INCLUDING A CRACK SENSING LINE

INCORPORATION BY REFERENCE TO ANY PRIORITY APPLICATIONS

This application claims priority to and the benefit of Korean Patent Application No. 10-2015-0018755 filed in the Korean Intellectual Property Office on Feb. 6, 2015, the entire contents of which are incorporated herein by reference.

BACKGROUND

Field

The described technology generally relates to a display device.

Description of the Related Technology

Ongoing research and development is being directed to flexible display devices which can be arranged in both flat and folded configurations.

When a crack is formed during the manufacturing of a display device, moisture or other contaminants can penetrate into the display area of the display device. This penetration of moisture causes failure of the display device.

Therefore, accurate detection of whether or not cracks have been formed in the external substrates (e.g., glass or plastic sheet) and potentially other fabrication layers of a display device is desirable.

SUMMARY OF CERTAIN INVENTIVE ASPECTS

One inventive aspect is a display device that can prevent a failure due to environmental penetration of the panel by air and moisture through the sensing of cracks in the substrate(s).

Another aspect is a display device including a substrate including a display area and a peripheral area neighboring the display area; a plurality of pixels formed in the display area of the substrate; and a plurality of signal lines formed in the substrate and connected to the plurality of pixels, wherein the plurality of signal lines include a plurality of data lines formed on the substrate, and a first crack sensing line connected to a first data line among the plurality of data lines and formed in the peripheral area, and the first crack sensing line includes a first portion having a relatively wide width and a second portion having a relatively narrow width.

The first portion can have a substantially polygonal shape.

The first portion can have a substantially quadrangular shape or a substantially rhombus shape.

The first portion of the first crack sensing line and the second portion of the first crack sensing line can overlap to each other via an insulating layer, and the first portion and the second portion can be connected to each other through a first hole formed in the insulating layer.

The first crack sensing line can include a first oblique portion forming a first angle with a direction that the data line extends and a second oblique portion forming a second angle with the direction that the data line extends, the first oblique portion and the second oblique portion can meet in a crossing portion, the first portion can be positioned at the first oblique portion and the second oblique portion, and the second portion can be positioned at the crossing portion.

A second hole formed on one straight line with the crossing portion and formed in the insulating layer overlapping the first crack sensing line can be further included.

The plurality of signal lines can include a first test signal line and a second test signal line formed in the peripheral area of the substrate, and the plurality of data lines can be connected to the first test signal line through a first switching element and can be connected to the second test signal line through a second switching element.

The first crack sensing line can be connected to the first data line through a first connection portion and a second connection portion, and the first crack sensing line can extend in a hemiring shape from the first connection portion to the second connection portion, The first crack sensing line can be connected between the second test signal line connected to the first data line and the second switching element connected to the first data line.

A first test gate line formed in the peripheral area of the substrate and connected to the first switching element and a second test gate line connected to the second switching element can be further included.

If the first test gate line is applied with a first gate-on voltage, the plurality of data lines can be applied with a first test signal from the first test signal line, and if the second test gate line is applied with a second gate-on voltage, the plurality of data lines can be applied with a first test signal from the second test signal line.

The second gate-on voltage can be applied after the first gate-on voltage is applied, and a magnitude of the first test voltage and a magnitude of the second test voltage can be different from each other.

Another aspect is a display device including a substrate including a display area and a peripheral area neighboring the display area; a plurality of pixels formed in the display area of the substrate; and a plurality of signal lines formed in the substrate and connected to the plurality of pixels, wherein the plurality of signal lines include a plurality of data lines formed on the substrate, and a first crack sensing line connected to a first data line among the plurality of data lines and formed in the peripheral area, and the first crack sensing line includes a first portion extending in a first direction and a second portion extending in a second direction different from the first direction.

The first portion and the second portion can be crossed in a crossing portion, the first portion can form a first angle with a direction that the data line extends, the second portion can form a second angle with a direction that the data line extends, and the first angle and the second angle can be less than or greater than about 90 degrees.

The first portion and the second portion can be crossed in a crossing portion, the first portion can extend parallel to a direction that the data line extends, and the second portion can extend perpendicular to the direction that the data line extends.

A second hole formed on one straight line with the crossing portion and formed in the insulating layer overlapping the first crack sensing line can be further included.

Another aspect is a display device comprising a substrate including a display area and a peripheral area neighboring the display area; a plurality of pixels formed over the substrate in the display area; and a plurality of signal lines formed over the substrate and connected to the pixels, wherein the signal lines include: a plurality of data lines formed over the substrate, and a first crack sensing line formed in the peripheral area and connected to a first data line, wherein the first crack sensing line is divided into first and second sections, and wherein the first section has a width that is greater than that of the second section.

In exemplary embodiments the first section has a polygonal shape. The first section can have a substantially quadrangular shape or a substantially rhombus shape. The first and second sections of the first crack sensing line can overlap each other with an insulating layer interposed therebetween and the first and second sections can be connected to each other through a first hole defined in the insulating layer.

In exemplary embodiments, the first crack sensing line extends in a first direction, wherein the first crack sensing line includes: i) a first oblique section that forms a first angle with the first direction and ii) a second oblique section forming a second angle with the first direction, wherein the first and second oblique sections are connected to each other via a crossing section, wherein the first and second oblique portions forms the first section, and wherein the crossing section forms the second section. The display device can further comprise a plurality of second holes formed in the insulating layer.

In exemplary embodiments, the signal lines include a first test signal line and a second test signal line formed over the substrate in the peripheral area, the first crack sensing line is connected to the first data line through a first connection portion and a second connection portion, the first crack sensing line forms a loop between the first and second connection portions, and the data lines are connected to: i) the first test signal line through a plurality of first switching elements and ii) the second test signal line through a plurality of second switching elements.

In exemplary embodiments, the first crack sensing line is connected between the second test signal line and one of the second switching elements. The display device can further comprise a first test gate line formed in the peripheral area of the substrate and connected to the first switching elements, and a second test gate line connected to the second switching elements.

In exemplary embodiments, the data lines are configured to receive a first test signal from the first test signal line in response to the first test gate line being applied with a first gate-on voltage, and the data lines are further configured to receive a second test signal from the second test signal line in response to the second test gate line being applied with a second gate-on voltage.

In exemplary embodiments, the second test gate line is further configured to receive the second gate-on voltage after the first test gate line the first gate-on voltage receives the first gate-on voltage, and wherein the magnitude of the first test voltage and the magnitude of the second test voltage are different from each other.

Another aspect is a display device comprising a substrate including a display area and a peripheral area neighboring the display area; a plurality of pixels formed over the substrate in the display area; and a plurality of signal lines formed over the substrate and connected to the pixels, wherein the signal lines include: a plurality of data lines formed over the substrate, and a first crack sensing line formed in the peripheral area and connected to a first data line, wherein the first crack sensing line is divided into first and second sections, and wherein the first section extends in a first direction and the second section extends in a second direction different from the first direction.

In exemplary embodiments, the data lines extend in a first direction, wherein the first and second sections are connected to each other in a crossing region, wherein the first section forms a first angle with the first direction, wherein the second section forms a second angle with the first direction, and wherein the first and second angles less than or greater than about 90 degrees.

In exemplary embodiments, the data lines extend in a first direction, wherein the first and second sections are connected to each other in a crossing region, wherein the first section extends in the first direction, and wherein the second section extends in a direction substantially perpendicular to the first direction. The display device can further comprise a plurality of holes formed in an insulating layer that overlaps the first crack sensing line.

In exemplary embodiments, the signal lines further include a first test signal line and a second test signal line formed over the substrate in the peripheral area, the first crack sensing line is connected to the first data line through a first connection portion and a second connection portion, the first crack sensing line forms a loop between the first and second connection portions, and the data lines are connected to: i) the first test signal line through a plurality of first switching elements and ii) the second test signal line through a plurality of second switching elements.

In exemplary embodiments, the first crack sensing line is connected between the second test signal line and the second switching elements. The display device can further comprise a first test gate line connected to the first switching elements and a second test gate line connected to the second switching elements, and wherein the first test gate line is formed in the peripheral area.

In exemplary embodiments, the data lines are configured to receive a first test signal from the first test signal line in response to the first test gate line being applied with a first gate-on voltage, and the data lines are further configure to receive a first test signal from the second test signal line in response to the second test gate line being applied with a second gate-on voltage.

In exemplary embodiments, the second test gate line is further configured to receive the second gate-on voltage after the first test gate line the first gate-on voltage receives the first gate-on voltage, and wherein the magnitude of the first test voltage and the magnitude of the second test voltage are different from each other.

According to at least one embodiment, the display device can easily sense cracks in the substrate(s) of the display device, thereby preventing failure of the display device due to the cracks.

DETAILED DESCRIPTION OF CERTAIN INVENTIVE EMBODIMENTS

Figure 1:
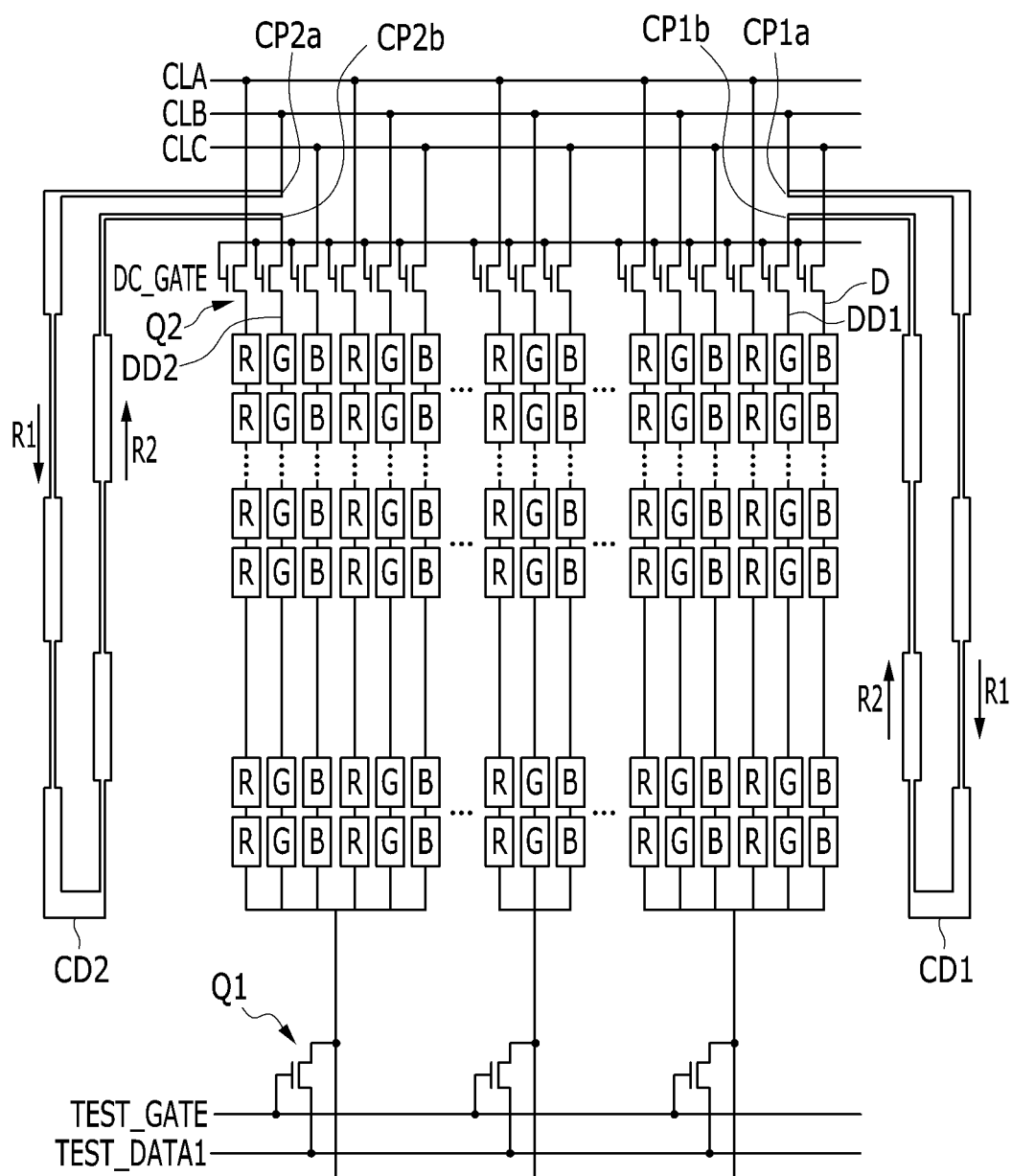
FIG. 1 is a layout view of a display device according to an exemplary embodiment.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

In the drawings, the thickness of layers, films, panels, regions, etc., may be exaggerated for the sake of clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
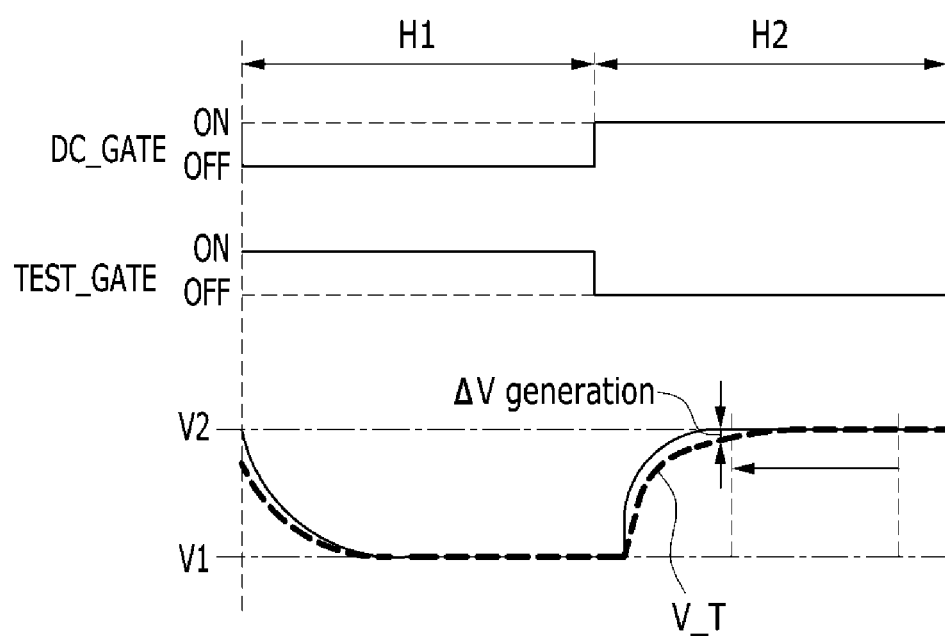
FIG. 2 is a waveform diagram of signals of a display device according to an exemplary embodiment.
Figure 3:
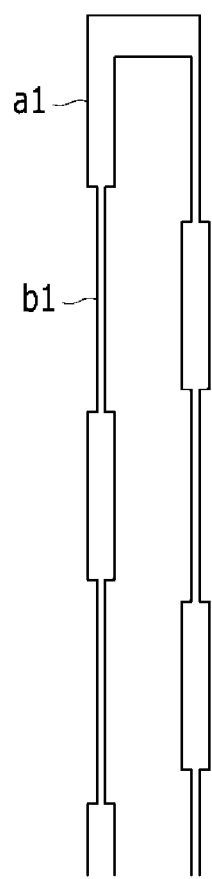
FIG. 3 is a view of a portion of the display device according to the exemplary embodiment shown in FIG. 1.

A display device according to an exemplary embodiment will be described with reference to FIG. 1 to FIG. 3. FIG. 1 is a layout view of a display device according to an exemplary embodiment. FIG. 2 is a waveform diagram of signals of a display device according to an exemplary embodiment. FIG. 3 is a view of a portion of the display device according to the exemplary embodiment shown in FIG. 1.

First, the display device will be described with reference to FIG. 1.

Referring to FIG. 1, the display device includes a display area in which a plurality of pixels R, G, and B are formed and a peripheral area circumjacent to the display area.

The display device includes a plurality of pixels R, G, and B formed on a substrate and a plurality of signal lines connected thereto. The pixels R, G, and B are formed in the display area of the substrate, and at least a portion of the signal lines are formed in the peripheral area of the substrate.

The signal lines include a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data line D.

A first crack sensing line CD1 is connected to a first data line DD1 and a second crack sensing line CD2 is connected to a second data line DD2.

The first crack sensing line CD1 and the second crack sensing line CD2 are arranged on opposing sides of the pixels R, G, and B, and are positioned in the peripheral area adjacent to edges of the display area in which the pixels R, G, and B are formed.

The first crack sensing line CD1 is connected to the first data line DD1 through a first connection portion CP1a and a second connection portion CP1b. The first crack sensing line CD1 is connected to the first and second connection portions CP1a and CP1b and extends from the first connection portion CP1a in a first direction R1 along the peripheral area adjacent to the edge of the display area including a plurality of pixels R, G, and B. The first crack sensing line CD1 also extends in a second direction R2 that is opposite to the first direction R1 to be connected to the first data line DD1 through the second connection portion CP1b. Similarly, the second crack sensing line CD2 is connected to the second data line DD2 through a third connection portion CP2a and a fourth connection portion CP2b. The second crack sensing line CD2 is connected to the third and fourth connection portions CP2a and CP2b and extends from the third connection portion CP2a in the first direction R1 along the peripheral area adjacent to the edge of the display area including the plurality of pixels R, G, and B. The second crack sensing line CD2 also extends in the second direction R2 that is opposite to the first direction R1 to be connected to the first data line DD1 through the fourth connection portion CP2b.

As described above, the first and second crack sensing lines CD1 and CD2 are respectively formed adjacent to edges of the display area in the peripheral area, extend in the first direction R1 along the peripheral area from the connection portion of the first data line DD1 and the second data line DD2, extend in the second direction R2 opposite to the first direction R1, and are connected to the first data line DD1 and the second data line DD2, thereby forming a loop.

The first and second crack sensing lines CD1 and CD2 can be formed on the same layer as a gate line (not shown), and in this embodiment, the first and second crack sensing line CD1 and CD2 and the first and second data lines DD1 and DD2 can be connected to each other through a contact hole (not shown) formed in a gate insulating layer. Also, they can be connected to each other through a connecting member (not shown) covering first contact holes (not shown) that expose the first and second crack sensing lines CD1 and CD2 and second contact holes (not shown) that expose the first and second data lines DD1 and DD2.

The first and second crack sensing lines CD1 and CD2 can be formed on the same layer as the data lines D. In this embodiment, the first and second crack sensing lines CD1 and CD2 can be connected to the first and second data lines DD1 and DD2 via signal lines that cross the data lines D in a separate layer so as to be electrically insulated from the remaining data lines D.

Next, an operation of the display device according to an exemplary embodiment will be described with reference to FIG. 2.

Referring to FIG. 2, when the first test gate line TEST_GATE is applied with a gate-on signal ON, the first switching elements Q1 connected to the data lines D are turned on such that the first signal V1 applied to the first test signal line TEST_DATA1 is applied to the data lines D. In some embodiments, the first signal V1 is a signal for displaying white via the pixels R, G, and B.

By applying the first signal V1 to the data lines D, the plurality of pixels R, G, and B display a white image.

After the first test gate line TEST_GATE is applied with a gate-off signal OFF and the second test gate line DC_GATE is applied with the gate-on signal ON, the second switching elements Q2 connected to the data lines D are turned on, and the second signal V2 applied to the second test signal lines CLA, CLB, and CLC is applied to the data lines D. In some embodiments, the second signal V2 is a signal for displaying black via the pixels R, G, and B.

By applying the second signal V2 to the data lines D, the pixels R, G, and B display a black image.

In this embodiment, when a crack is formed in the peripheral area adjacent to the edge of the display area, damage is applied to at least one of the first and second crack sensing lines CD1 and CD2 formed in the peripheral area adjacent to the edge of the display area. Accordingly, the resistance of the first data line DD1 and/or the second data line DD2 connected to the first and second crack sensing lines CD1 and CD2 increases such that the voltage V_T applied to the pixels connected to the first and/or second data lines DD1 and DD2 is not charged to the second signal V2 resulting in a voltage difference ΔV comparted to the second signal V2.

Due to the voltage difference ΔV, the pixels connected to the first and/or second data lines DD1 and DD2 do not display the black image and instead emit light having a brightness that is greater than of the black image. Accordingly, any cracks that are formed in the peripheral area adjacent to the edge of the display area can be sensed by observing the light emitted via pixels connected to the first and/or second data lines DD1 and DD2.

However, although the crack is formed in the peripheral area adjacent to the edge of the display area, when the damage is not generated in the first and/or second crack sensing lines CD1 and CD2, it is difficult to sense the crack.

Next, the crack sensing line will be described with reference to FIG. 3 and FIG. 4.

Firstly, referring to FIG. 3, the first and second crack sensing lines CD1 and CD2 of the display device include a first portion or first section a1 having a relatively wide width and a second portion or second section b1 having a relatively narrow width.

When the crack is formed in the peripheral area adjacent to the edge of the display area, the possibility that the second portion b1 having the relatively narrow width is disconnected (e.g., open circuited) increases.

Figure 4:
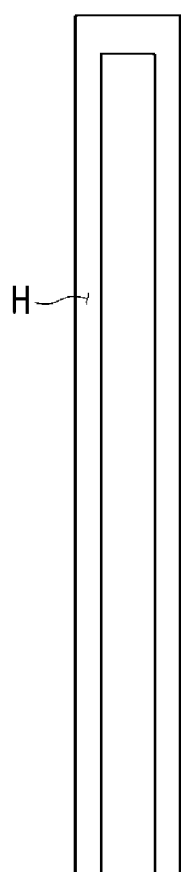
FIG. 4 is a view of a portion of a standard display device.

However, referring to FIG. 4, the crack sensing line of the display device according to the standard display device has a constant width. Accordingly, when a crack is formed in the peripheral area adjacent to the edge of the display area, a constant damage portion H may be generated in the crack sensing line, however, it is difficult for the crack sensing line to be disconnected.

In this way, according to at least one embodiment of the display device, by forming the crack sensing line to include the first portion a1 having the relatively wider width and the second portion b1 having the relatively narrower width, when a crack is formed in the peripheral area adjacent to the edge of the display area, the crack sensing line is easily disconnected. Accordingly, cracks formed in the display device are easily sensed, thereby preventing the failure of the display device due to the crack.

Figure 5:
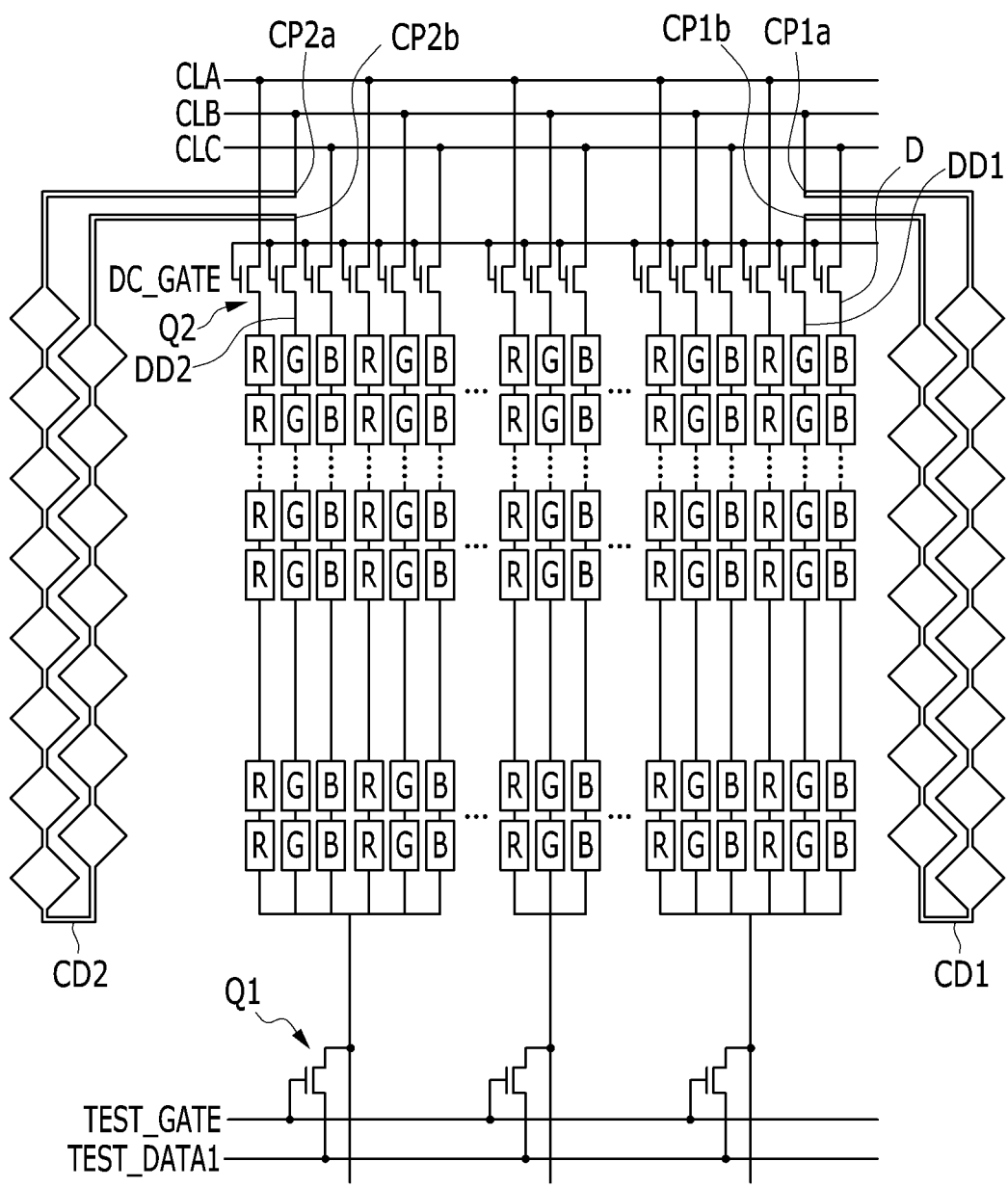
FIG. 5 is a layout view of a display device according to another exemplary embodiment.
Figure 6:
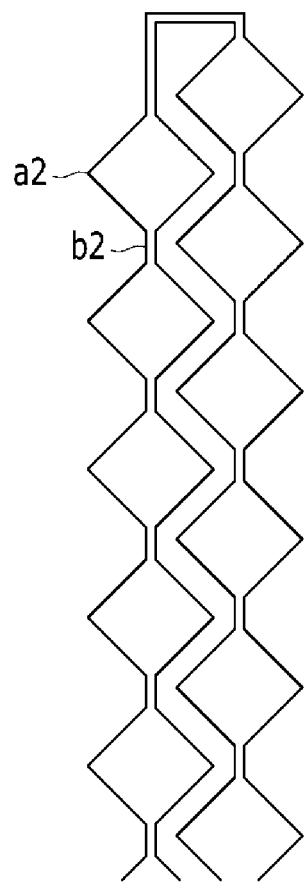
FIG. 6 is a view of a portion of the display device according to the exemplary embodiment shown in FIG. 5.

Next, the display device according another exemplary embodiment will be described with reference to FIG. 5 and FIG. 6. FIG. 5 is a layout view of a display device according to another exemplary embodiment. FIG. 6 is a view of a portion of the display device according to the exemplary embodiment shown in FIG. 5.

Referring to FIG. 5 and FIG. 6, the display device is similar to the display device according to the exemplary embodiment described with reference to FIG. 1 to FIG. 3. The detailed description for the same constituent elements is omitted.

Referring to FIG. 5 and FIG. 6, the display device includes a plurality of pixels R, G, and B and a plurality of signal lines connected thereto.

The signal lines include a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1a and the second connection portion CP1b and the second crack sensing line CD2 is connected to the second data line DD2 through the third connection portion CP2a and the fourth connection portion CP2b.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching element Q2 connected to the data lines D is turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first crack sensing line CD1 and/or the second crack sensing line CD2 formed in the peripheral area adjacent to the edge of the display area. Accordingly, the resistance of the first and/or second data lines DD1 and DD2 connected to the first and second crack sensing lines CD1 and CD2 increases, thereby the voltage V_T applied to the pixels connected to the first and/or second data lines DD1 and DD2 is not charged to the second signal V2 and a voltage difference ΔV is generated in the second signal V2 applied to the pixels connected to the first and/or second data lines DD1 and DD2.

Due to the voltage difference ΔV, the pixels connected to the first and/or second data lines DD1 and DD2 does not display the black image, but instead emit light having a brightness that is greater than that of the black image. Accordingly, and cracks that are be formed in the peripheral area adjacent to the edge of the display area can be sensed.

The first and second crack sensing lines CD1 and CD2 of the display device according to an exemplary embodiment include a third portion a2 having the relatively wide width and a fourth portion b2 having the relatively narrow width.

The third portion a2 having the wide width has a substantially rhombus shape. When a crack is formed in the peripheral area adjacent to the edge of the display device, the possibility that a disconnection is generated in the fourth portion b2 increases.

Thus, according to at least one embodiment, the display device includes the crack sensing line which includes the third portion a3 having the relatively wide width and the fourth portion b3 having the relatively narrow width. Thus, when a crack is formed in the peripheral area adjacent to the edge of the display area, the crack sensing line can be easily disconnected. Accordingly, the display device can easily sense the formation of the crack, and thus, the failure of the display device due to the crack can be prevented.

Many characteristics of the display device according to the exemplary embodiment described with reference to FIG. 1 to FIG. 3 can be applied to the display device according to the present exemplary embodiment.

Figure 7:
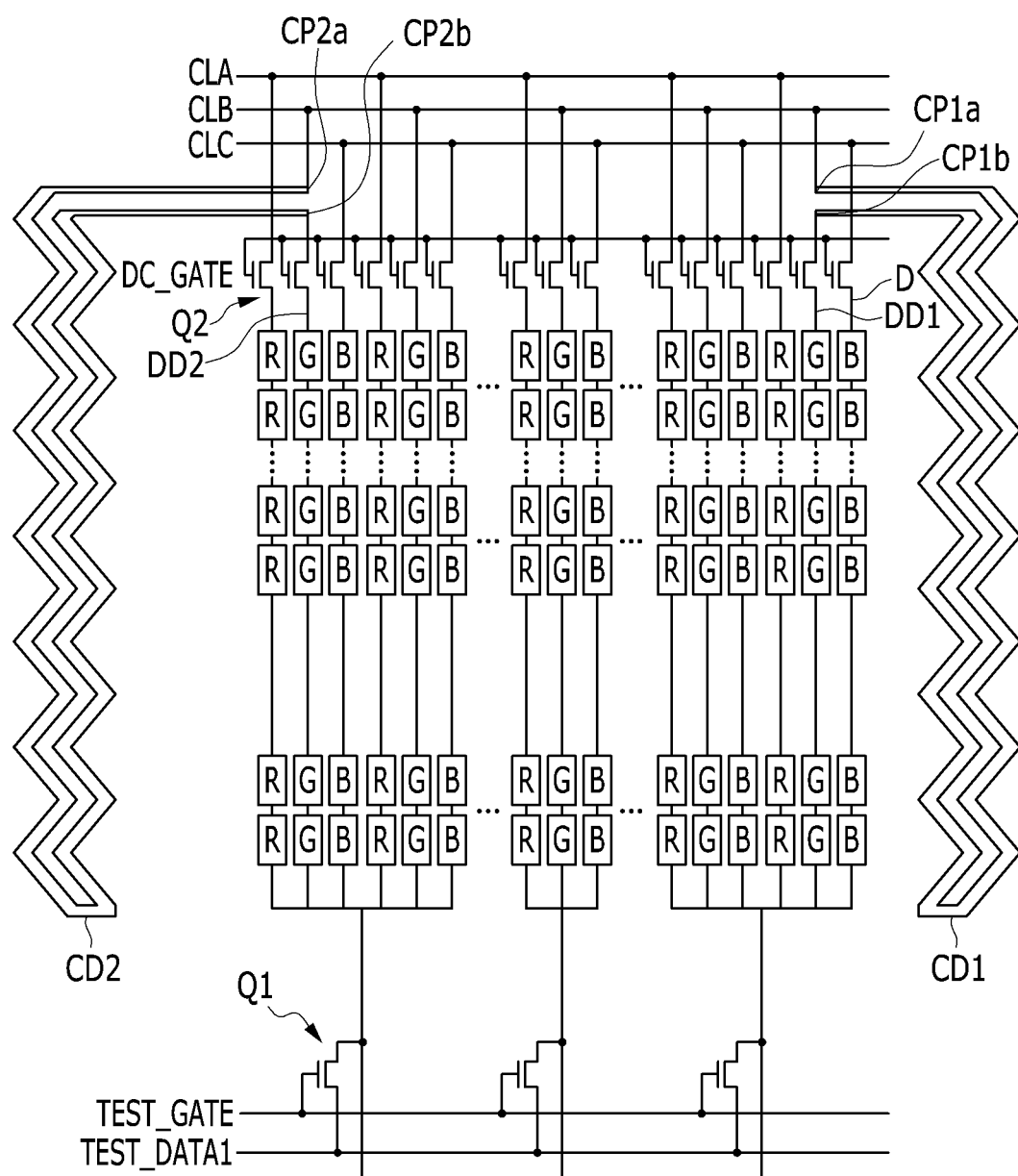
FIG. 7 is a layout view of a display device according to another exemplary embodiment.
Figure 8:
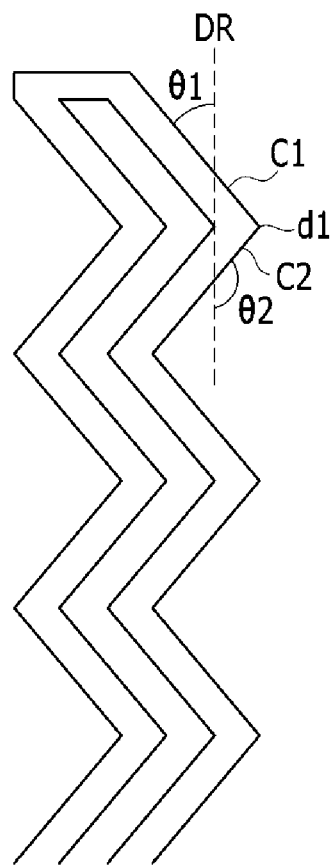
FIG. 8 is a view of a portion of the display device according to the exemplary embodiment shown in FIG. 7.

Next, the display device according to another exemplary embodiment will be described with reference to FIG. 7 and FIG. 8. FIG. 7 is a layout view of a display device according to another exemplary embodiment. FIG. 8 is a view of a portion of the display device according to the exemplary embodiment shown in FIG. 7.

Referring to FIG. 7 and FIG. 8, the display device is similar to the display device according to the exemplary embodiment described with reference to FIG. 1 to FIG. 3. The detailed description of the same constituent elements is omitted.

Referring to FIG. 7 and FIG. 8, the display device includes a plurality of pixels R, G, and B and a plurality of signal lines connected thereto.

The signal lines include a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of to the pixels R, G, and B and are formed in the peripheral area adjacent to edges of the display area including the pixels R, G, and B.

The first crack sensing line CD1 is connected to the first data line DD1 through the first connection portion CP1$a$ and the second connection portion CP1$b$. The second crack sensing line CD2 is connected to the second data line DD2 through the third connection portion CP2$a$ and the fourth connection portion CP2$b$.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching elements Q2 connected to the data lines D are turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first crack and/or second sensing lines CD1 and CD2 formed in the peripheral area adjacent to the edge of the display area. Accordingly, the resistance of the first and/or second data lines DD1 and DD2 connected to the first crack and second sensing lines CD1 and CD2 increases. Accordingly, the voltage V_T applied to the pixel connected to the first and/or second data lines DD1 and DD2 is not charged to the second signal V2 and the voltage difference ΔV for the second signal V2.

Due to the voltage difference ΔV, the pixels connected to the first and/or second data lines DD1 and DD2 do not display the black image, but instead emit light having a brightness that is greater than that of the black image. Accordingly, cracks that are formed in the peripheral area adjacent to the edge of the display area can be sensed.

The first and second crack sensing lines CD1 and CD2 of the display device according to an exemplary embodiment include a first oblique portion C1 forming a first angle θ1 with the direction DR in which the data line extends and a second oblique portion C2 forming a second angle θ2 with the direction DR. The first and second oblique portions C1 and C2 are connected to each other at a first crossing portion or connection region d1.

When a crack is formed in the peripheral area adjacent to the edge of the display device, the possibility that a disconnection is generated in the first crossing portion d1 where the first and second oblique portions C1 and C2 are connected to each other is greater than in the standard display device.

Thus, according to at least one embodiment, the display device includes the crack sensing lines which include the first and second oblique portions C1 and C2 extending in different directions which are connected to each other at the first crossing portion d1. Thus, when a crack is formed in the peripheral area adjacent to the edge of the display area, the crack sensing line is easily disconnected. Accordingly, the crack in the display device can be sensed, thereby preventing the failure of the display device due to the crack.

Many characteristics of the display device according to the exemplary embodiment described with reference to FIG. 1 to FIG. 3 can be applied to the display device according to the present exemplary embodiment.

Figure 9:
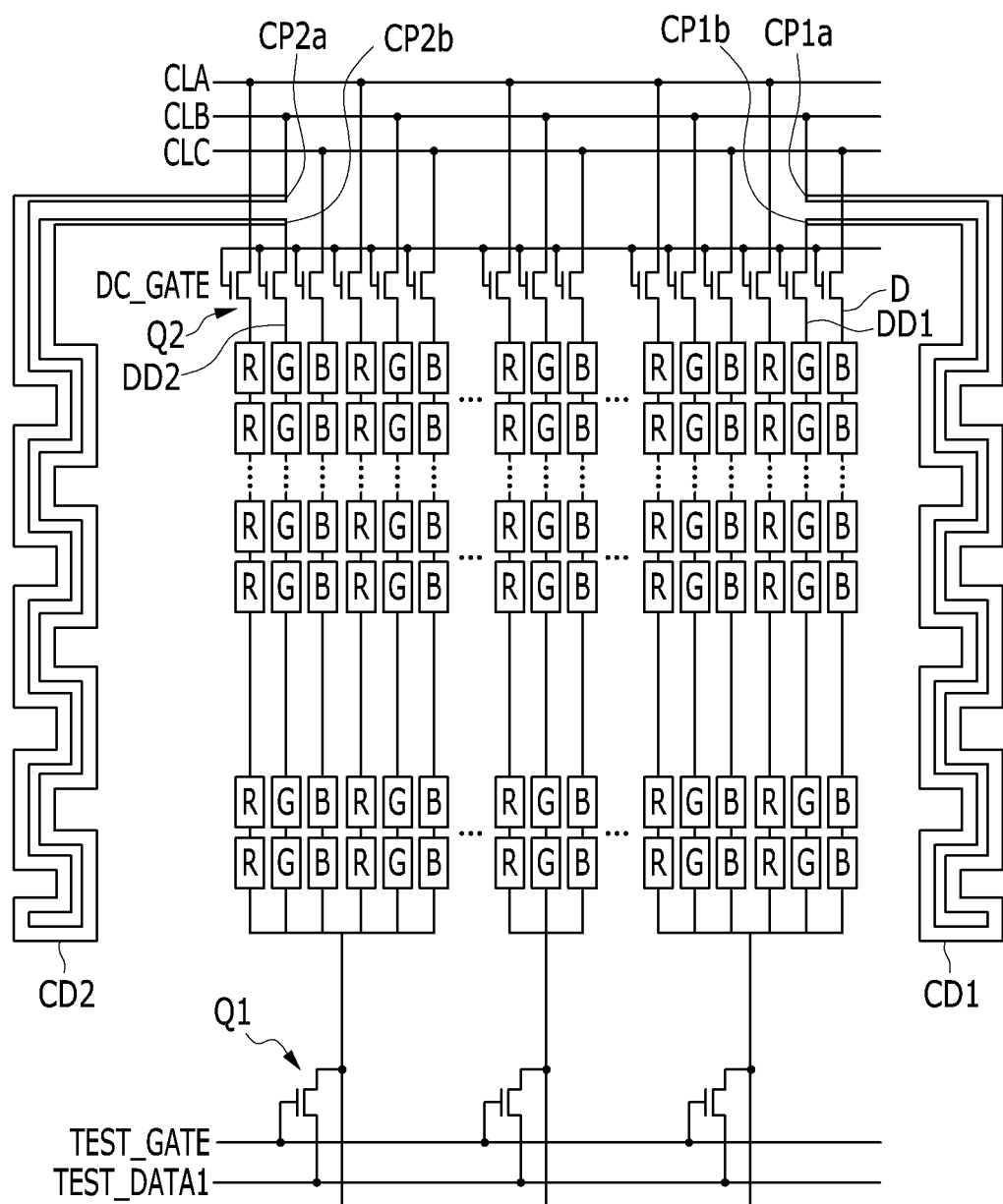
FIG. 9 is a layout view of a display device according to another exemplary embodiment.
Figure 10:
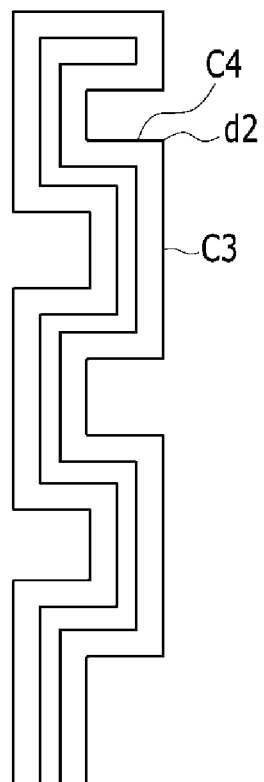
FIG. 10 is a view of a portion of the display device according to the exemplary embodiment shown in FIG. 9.

Next, the display device according to another exemplary embodiment will be described with reference to FIG. 9 and FIG. 10. FIG. 9 is a layout view of a display device according to another exemplary embodiment. FIG. 10 is a view of a portion of the display device according to the exemplary embodiment shown in FIG. 9.

Referring to FIG. 9 and FIG. 10, the display device according to the present exemplary embodiment is similar to the display device according to the exemplary embodiment described with reference to FIG. 1 to FIG. 3. The detailed description of the same constituent elements is omitted.

Referring to FIG. 9 and FIG. 10, the display device includes a plurality of pixels R, G, and B and a plurality of signal lines connected thereto.

The signal lines include a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1a and the second connection portion CP1b, and the second crack sensing line CD2 is connected to the second data line DD2 through the third connection portion CP2a and the fourth connection portion CP2b.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching elements Q2 connected to the data lines D are turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first and/or second crack sensing lines CD1 CD2 formed in the peripheral area adjacent to the edge of the display area. Accordingly, the resistance of the first and/or second data lines DD1 and DD2 connected to the first and second crack sensing lines CD1 and CD2 increases. Accordingly, the voltage V_T applied to the pixels connected to the first and/or second data lines DD1 and DD2 is not charged to the second signal V2 and the voltage difference ΔV for the second signal V2 is generated.

Due to the voltage difference ΔV, the pixels connected to the first and/or second data lines DD1 and DD2 do not display the black image, but instead emit light having a brightness that is greater than that of the black image. Accordingly, cracks that are be generated in the peripheral area adjacent to the edge of the display area can be sensed.

The first and second crack sensing lines CD1 and CD2 of the display device include a first straight portion C3 formed substantially parallel to the direction DR in which the data line extends and a second straight portion C4 formed substantially perpendicular to the direction DR. The first and second straight portions C3 and C4 are connected to each other at a second crossing portion d2.

When a crack is formed in the peripheral area adjacent to the edge of the display device, the possibility that a disconnection is generated in the second crossing portion d2 where the first and second straight portions C3 and C4 extending in the different directions is greater than in the standard display device.

Thus, the display device according to at least one exemplary embodiment includes the crack sensing line which includes the first and second straight portions C3 and C4 extending in the different directions and being connected to each other at the second crossing portion d2. Thus, when a crack is formed in the peripheral area adjacent to the edge of the display area, the crack sensing line is easily disconnected. Accordingly, cracks in the display device can be sensed, thereby preventing the failure of the display device due to the cracks.

Many characteristics of the display device according to the exemplary embodiment described with reference to FIG. 1 to FIG. 3 can be applied to the display device according to the present exemplary embodiment.

Figure 11:
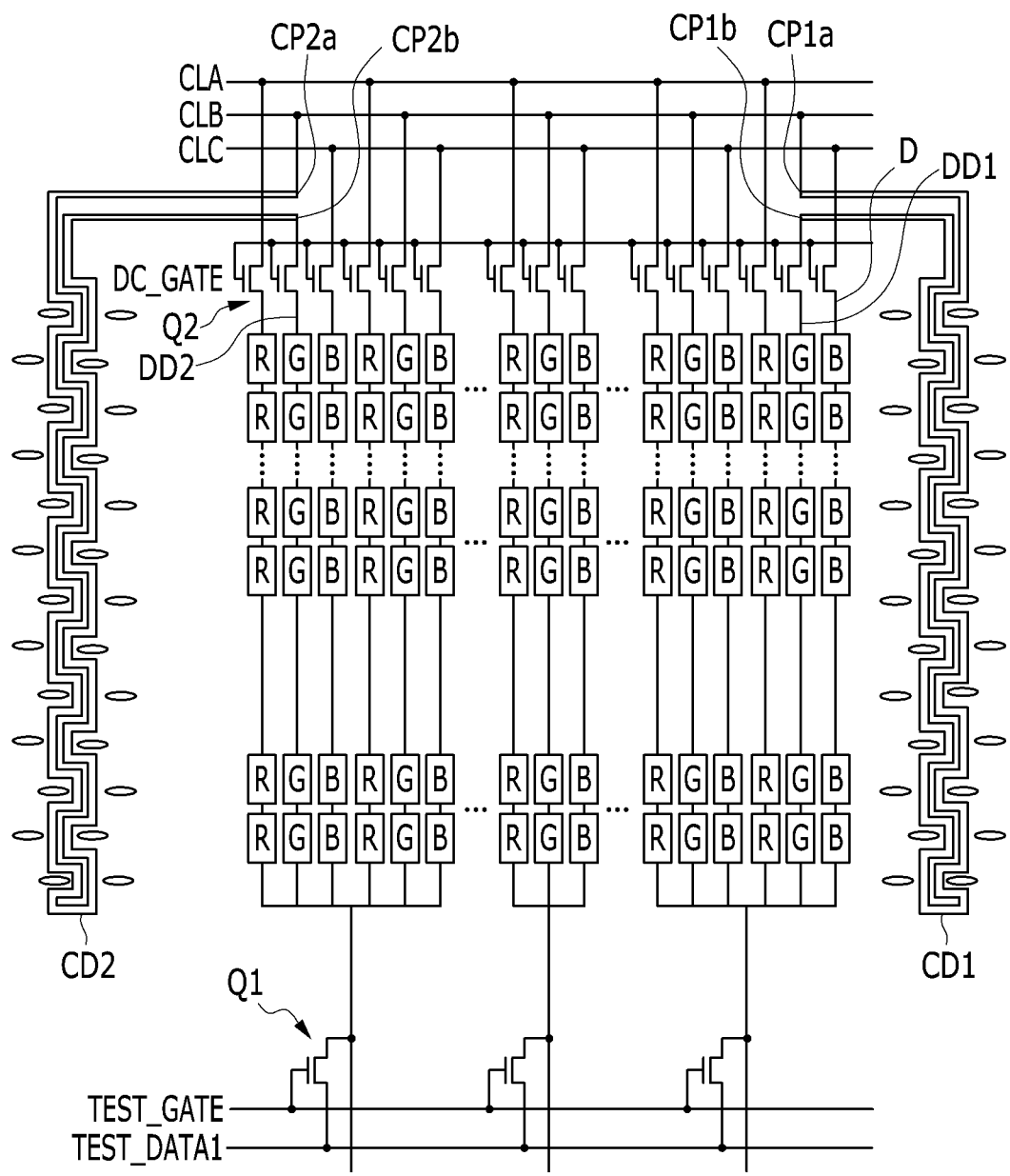
FIG. 11 is a layout view of a display device according to another exemplary embodiment.
Figure 12:
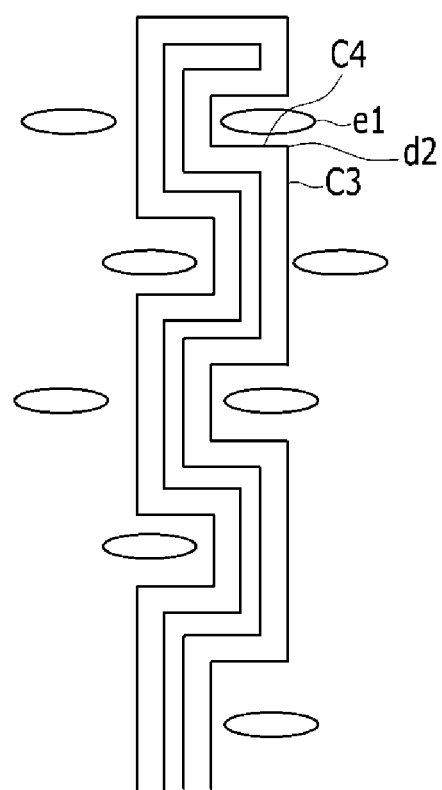
FIG. 12 is a view of a portion of the display device according to the exemplary embodiment shown in FIG. 11.

Next, the display device according to another exemplary embodiment will be described with reference to FIG. 11 and FIG. 12. FIG. 11 is a layout view of a display device according to another exemplary embodiment. FIG. 12 is a view of a portion of the display device according to the exemplary embodiment shown in FIG. 11.

Referring to FIG. 11 and FIG. 12, the display device according to the present exemplary embodiment is similar to the display device according to the exemplary embodiment described with reference to FIG. 1 to FIG. 3. The detailed description of the same constituent elements is omitted.

Referring to FIG. 11 and FIG. 12, the display device includes a plurality of pixels R, G, and B and a plurality of signal lines connected thereto.

The signal lines includes a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1a and the second connection portion CP1b, and the second crack sensing line CD2 is connected to the second data line DD2 through the third connection portion CP2a and the fourth connection portion CP2b.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the plurality of pixels R, G, and B display a white image.

After the first test gate line TEST_GATE is applied with the gate-off signal OFF and the second test gate line DC_GATE is applied with the gate-on signal ON, the second switching element Q2 connected to the data lines D is turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first and/or second crack sensing lines CD1 and CD2 formed in the peripheral area adjacent to the edge of the display area. Accordingly, the resistance of the first and/or second data lines DD1 and DD2 connected to the first and second crack sensing lines CD1 and CD2 increases. Thus, the voltage V_T applied to the pixel connected to the first data line DD1 and the second data line DD2 is not charged to the second signal V2 and the voltage difference ΔV for the second signal V2 is generated.

Due to the voltage difference ΔV, the pixels connected to the first and/or second data lines DD1 and DD2 do not display the black image, but instead emit light having a brightness that is greater than that of the black image. Accordingly, cracks that are generated in the peripheral area adjacent to the edge of the display area can be sensed.

The first and second crack sensing lines CD1 and CD2 of the display device according to an exemplary embodiment include a first straight portion C3 formed substantially parallel to the direction DR in which the data line extends and a second straight portion C4 formed substantially perpendicular to the direction DR. The first and second straight portions C3 and C4 are connected to each other at the second crossing portion d2. Also, a plurality of first holes e1 are formed on the sides of the first and second crack sensing lines CD1 and CD2. The first holes e1 are formed in the insulating layer on the sides of the first and second crack sensing lines CD1 and CD2.

When a crack is formed in the peripheral area adjacent to the edge of the display device, the possibility that the disconnection is generated in the second crossing portion d2 where the first and second straight portions C3 and C4 are connected is greater than in the standard display device. Also, since the first holes e1 are formed next to the sides of the first and second crack sensing lines CD1 and CD2, the thickness of the insulating layer formed under or on the first and second crack sensing lines CD1 and CD2 are thin in the areas where the first holes e1 are formed. Accordingly, when a crack is formed in the peripheral area adjacent to the edge of the display device, the crack may traverse the first and second crack sensing lines CD1 and CD2 via the area where the first hole e1 is formed. Accordingly, the first and second crack sensing lines CD1 and CD2 can be easily disconnected.

The display device according to at least one exemplary embodiment, includes the crack sensing line which includes the first and second straight portions C3 and C4 extending in the different directions and which are connected to each other at the first crossing portion d1. The display device also includes the first holes e1 formed on the sides of the first and second crack sensing lines CD1 and CD2. Accordingly, when a crack is formed in the peripheral area adjacent to the edge of the display area, the crack sensing line is easily disconnected. Accordingly, cracks in the display device can be sensed, thereby preventing the failure of the display device due to the crack.

Many characteristics of the display device according to the exemplary embodiment described with reference to FIG. 1 to FIG. 3 can be applied to the display device according to the present exemplary embodiment.

Figure 13:
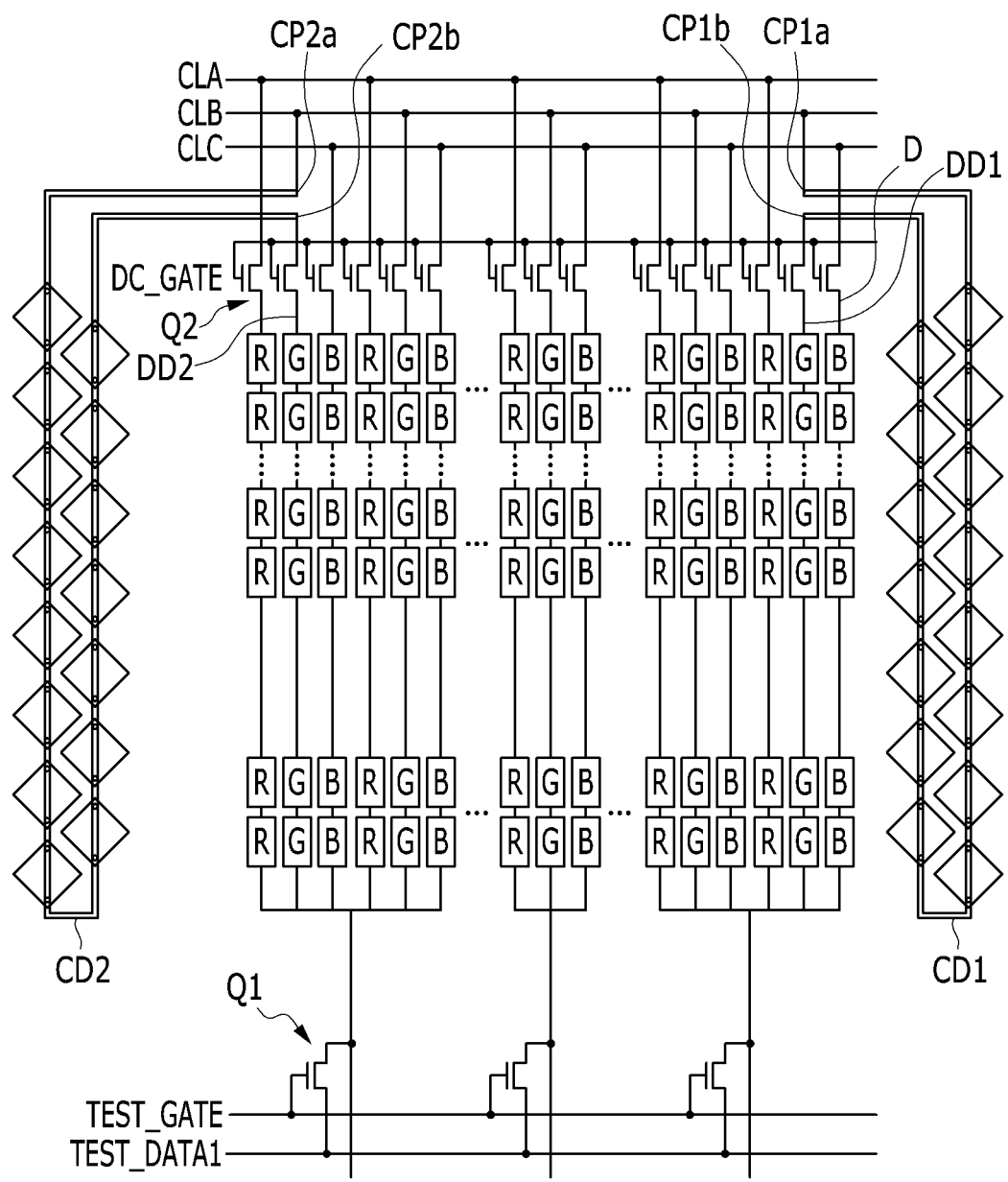
FIG. 13 is a layout view of a display device according to another exemplary embodiment.
Figure 14:
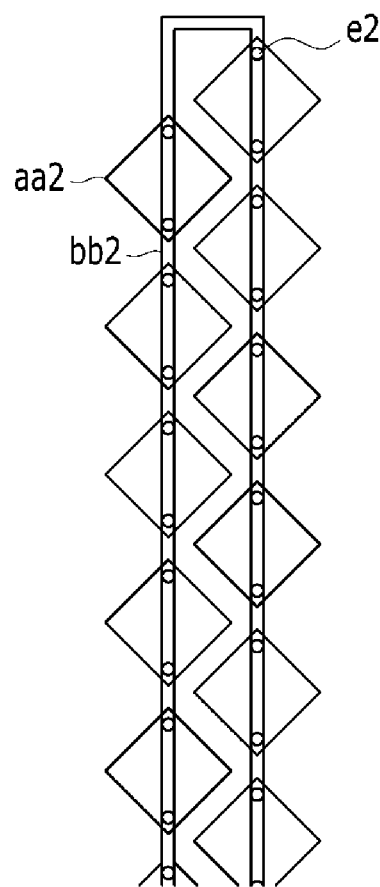
FIG. 14 is a view of a portion of the display device according to the exemplary embodiment shown in FIG. 13.

Next, the display device according to another exemplary embodiment will be described with reference to FIG. 13 and FIG. 14. FIG. 13 is a layout view of a display device according to another exemplary embodiment. FIG. 14 is a view of a portion of the display device according to the exemplary embodiment shown in FIG. 13.

Referring to FIG. 13 and FIG. 14, the display device is similar to the display device according to the exemplary embodiment described with reference to FIG. 1 to FIG. 3. The detailed description of the same constituent elements is omitted.

Referring to FIG. 13 and FIG. 14, the display device includes a plurality of pixels R, G, and B and a plurality of signal lines connected thereto.

The signal lines includes a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the plurality of data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1$a$ and the second connection portion CP1$b$, and the second crack sensing line CD2 is connected to the second data line DD2 through the third connection portion CP2$a$ and the fourth connection portion CP2$b$.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching elements Q2 connected to the data lines D are turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first and/or second crack sensing lines CD1 and CD2 formed in the peripheral area adjacent to the edge of the display area. Accordingly, the resistance of the first and/or second data lines DD1 and DD2 connected to the first and second crack sensing lines CD1 and CD2 increases. Thus, the voltage V_T applied to the pixel connected to the first and/or second data lines DD1 and DD2 is not charged to the second signal V2 and the voltage difference ΔV for the second signal V2 is generated.

Due to the voltage difference ΔV, the pixels connected to the first and/or second data lines DD1 and DD2 does not display the black image, but instead emit light having a brightness that is greater than that of the black image. Accordingly, cracks that are generated in the peripheral area adjacent to the edge of the display area can be sensed.

The first and second crack sensing lines CD1 and CD2 of the display device according to an exemplary embodiment include a fifth portion aa2 having the relatively wide width and a sixth portion bb2 having the relatively narrow width.

The fifth portion aa2 having the wide width has a substantially rhombus shape.

The sixth portion bb2 having the narrow width and the fifth portion aa2 having the wide width overlap with the insulating layer interposed therebetween. The fifth and sixth portions aa2 and bb2 are connected through second holes e2 formed in the insulating layer.

When a crack is formed in the peripheral area adjacent to the edge of the display device, the probability of disconnection in the sixth portion bb2 having the narrow width is greater than in the standard display device. The resistance of the first and second crack sensing lines CD1 and CD2 increases when the disconnection occurs, and thus, delays in the signal flowing to the first and second crack sensing lines CD1 and CD2 can be prevented.

Thus, the display device according to at least one exemplary includes the crack sensing line which includes the fifth portion aa2 having the relatively wide width and the sixth portion bb2 having the relatively narrow width. Thus, when a crack is formed in the peripheral area adjacent to the edge of the display area, the crack sensing line is easily disconnected and the signal delay of the crack sensing line can be prevented. Accordingly, the crack in the display device can be sensed, thereby preventing the failure of the display device due to the crack.

Many characteristics of the display device according to the exemplary embodiment described with reference to FIG. 1 to FIG. 3 can be applied to the display device according to the present exemplary embodiment.

Figure 15:
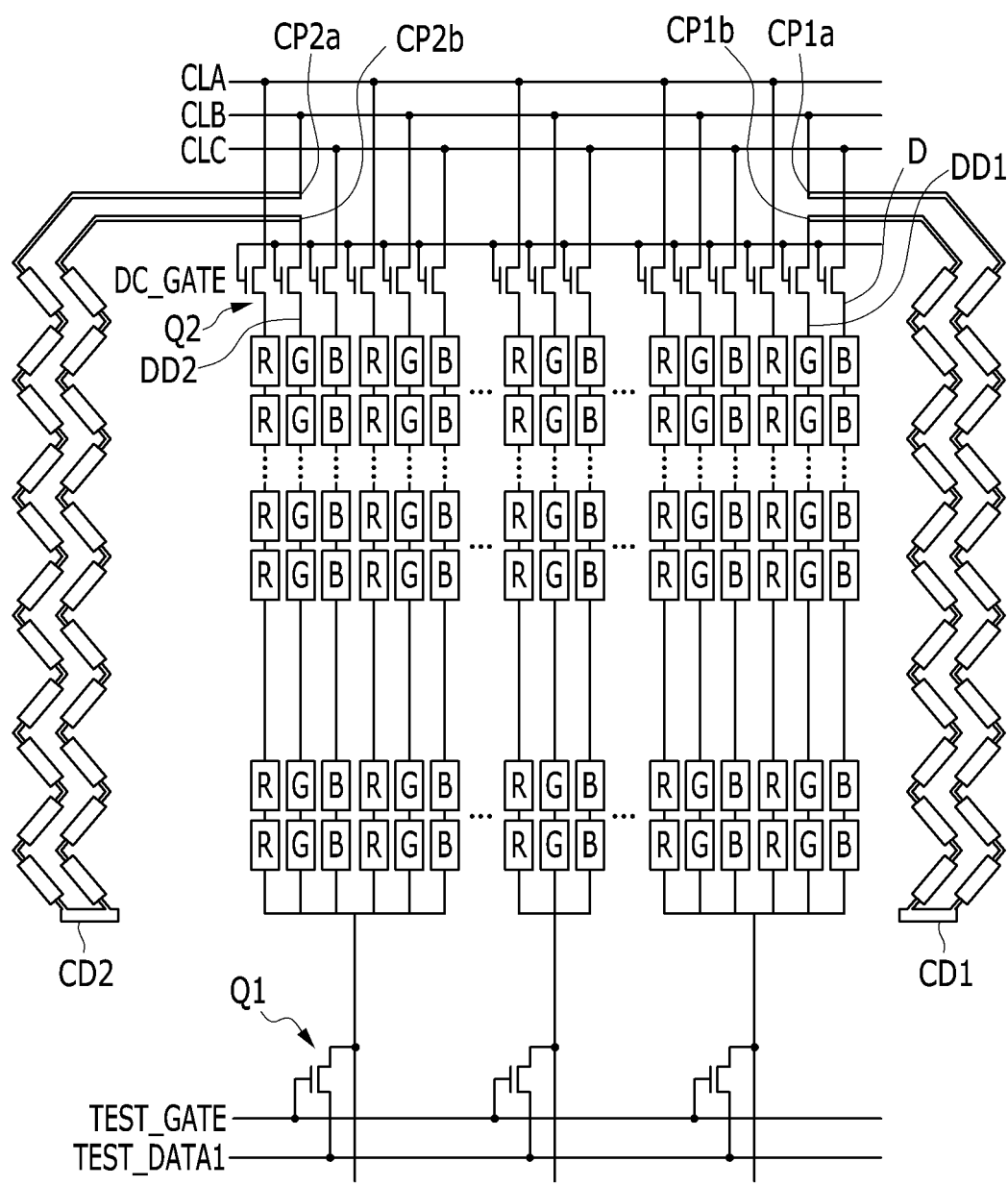
FIG. 15 is a layout view of a display device according to another exemplary embodiment.
Figure 16:
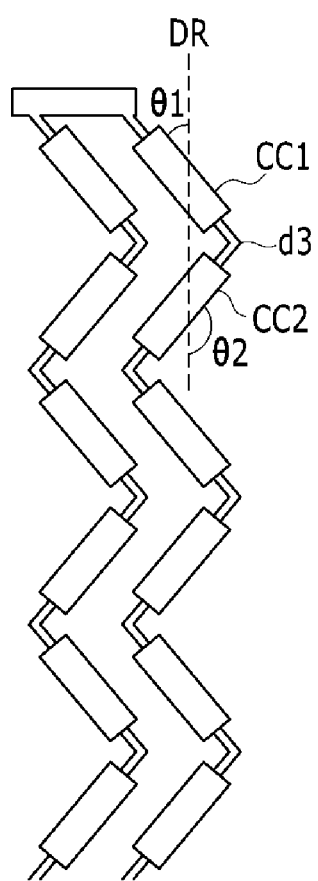
FIG. 16 is a view of a portion of the display device according to the exemplary embodiment shown in FIG. 15.

Next, the display device according to another exemplary embodiment will be described with reference to FIG. 15 and FIG. 16. FIG. 15 is a layout view of a display device according to another exemplary embodiment. FIG. 16 is a view of a portion of the display device according to the exemplary embodiment shown in FIG. 15.

Referring to FIG. 15 and FIG. 16, the display device according to the present exemplary embodiment is similar to the display device according to the exemplary embodiment described with reference to FIG. 1 to FIG. 3. The detailed description of the same constituent elements is omitted.

Referring to FIG. 15 and FIG. 16, the display device includes a plurality of pixels R, G, and B and a plurality of signal lines connected thereto.

The signal lines include a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1*a* and the second connection portion CP1*b*, and the second crack sensing line CD2 is connected to the second data line DD2 through the third connection portion CP2*a* and the fourth connection portion CP2*b*.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching elements Q2 connected to the data lines D are turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first and/or second crack sensing lines CD1 and CD2 formed in the peripheral area adjacent to the edge of the display area. Accordingly, the resistance of the first and/or second data lines DD1 and DD2 connected to the first and second crack sensing lines CD1 and CD2 increases. Thus, the voltage V_T applied to the pixels connected to the first and/or second data lines DD1 and DD2 is not charged to the second signal V2 and the voltage difference $\Delta V$ for the second signal V2 is generated.

Due to the voltage difference $\Delta V$, the pixels connected to the first and/or second data lines DD1 and DD2 do not display the black image, but instead emit light having a brightness that is greater than that of the black image. Accordingly, cracks that are generated in the peripheral area adjacent to the edge of the display area can be sensed.

The first and second crack sensing lines CD1 and CD2 of the display device according to an exemplary embodiment include a third oblique portion CC1 forming a first angle $\theta 1$ with the direction DR in which the data line extends and a fourth oblique portion CC2 forming a second angle $\theta 2$ with the direction DR. The third and fourth oblique portions CC1 and CC2 are connected to each other at the third crossing portion d3.

The third and fourth oblique portions CC1 and CC2 have a relatively wide width, and the third crossing portion d3 has a relatively narrow width.

When a crack is formed in the peripheral area adjacent to the edge of the display device, the probability of disconnection is increased in the third crossing portion d3 where the third oblique portion CC1 and the fourth oblique portion CC2 are connected to each other compared to the standard display device.

By increasing the width of the third oblique portion CC1 and the fourth oblique portion CC2 with respect to the third crossing portion d3, the resistance of the first and second crack sensing lines CD1 and CD2 decreases. Accordingly, delays in the signal flowing through the first and second crack sensing lines CD1 and CD2 also decrease.

Thus, the display device according to at least one exemplary embodiment includes the crack sensing line which include the third and fourth oblique portions CC1 and CC2 extending in the different directions and connected to each other at the third crossing portion d3. Further, by decreasing the width of the third crossing portion d3, when a crack is formed in the peripheral area adjacent to the edge of the display area, the crack sensing line can be easily disconnected. Accordingly, cracks in the display device can be sensed, thereby preventing the failure of the display device due to the cracks.

Many characteristics of the display device according to the exemplary embodiment described with reference to FIG. 1 to FIG. 3 can be applied to the display device according to the present exemplary embodiment.

Figure 17:
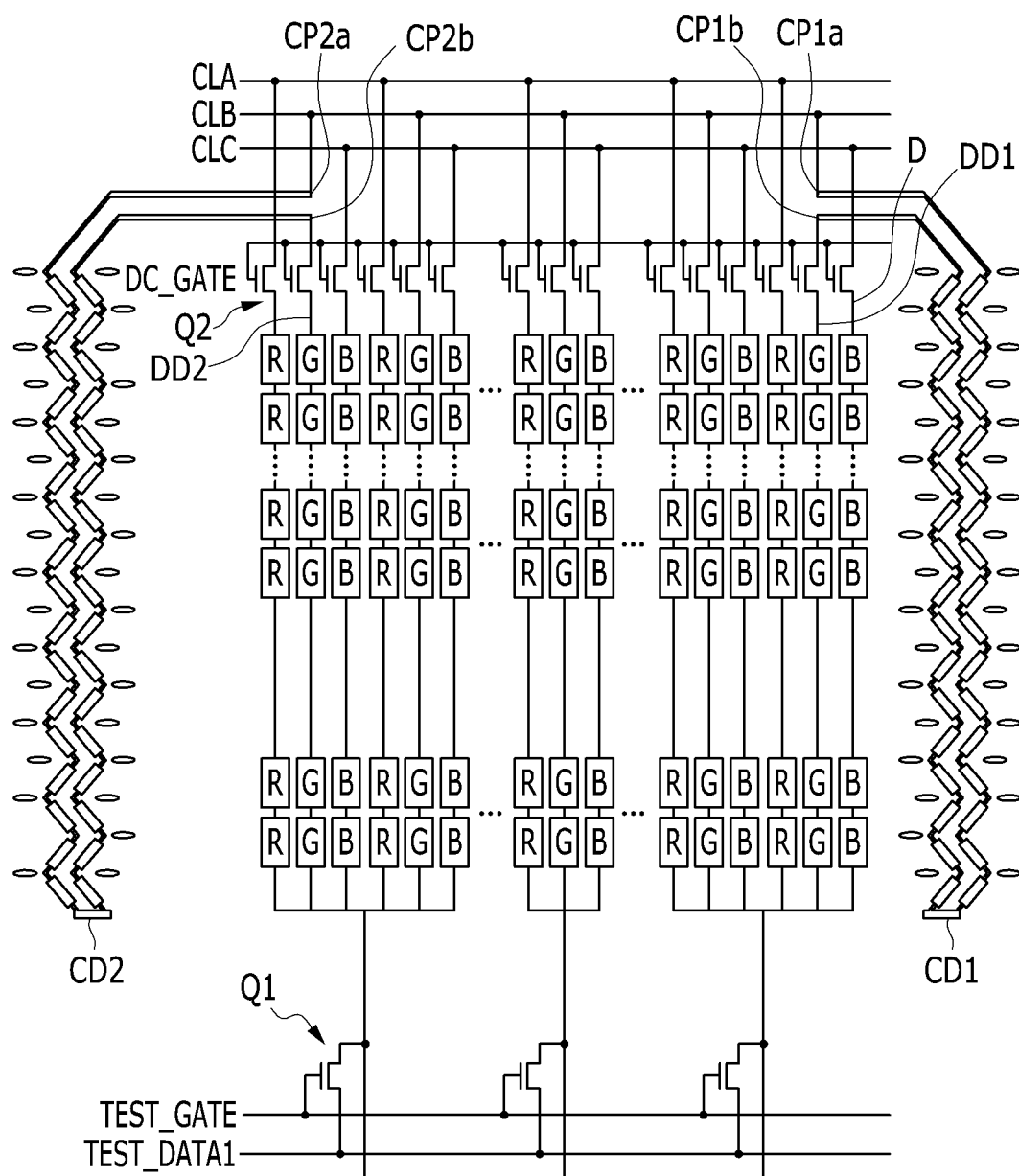
FIG. 17 is a layout view of a display device according to another exemplary embodiment.
Figure 18:
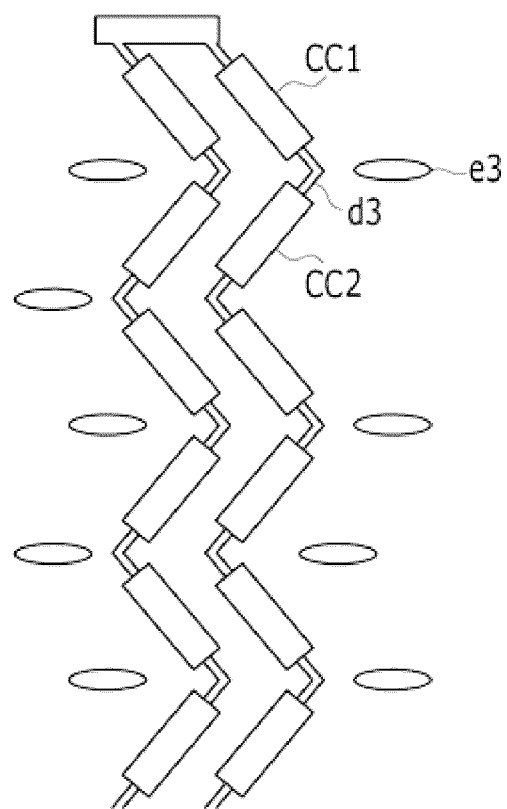
FIG. 18 is a view of a portion of the display device according to the exemplary embodiment shown in FIG. 17.

Next, the display device according to another exemplary embodiment will be described with reference to FIG. 17 and FIG. 18. FIG. 17 is a layout view of a display device according to another exemplary embodiment. FIG. 18 is a view of a portion of the display device according to the exemplary embodiment shown in FIG. 17.

Referring to FIG. 17 and FIG. 18, the display device according to the present exemplary embodiment is similar to the display device according to the exemplary embodiment described with reference to FIG. 1 to FIG. 3. The detailed description of the same constituent elements is omitted.

Referring to FIG. 17 and FIG. 18, the display device includes a plurality of pixels R, G, and B and a plurality of signal lines connected thereto.

The signal lines includes a first test gate line TEST_GATE, a second test gate line DC_GATE, a plurality of data lines D, a first test signal line TEST_DATA1, a plurality of second test signal lines CLA, CLB, and CLC, a first crack sensing line CD1, and a second crack sensing line CD2.

A plurality of first switching elements Q1 are connected to the first test gate line TEST_GATE, the first test signal line TEST_DATA1, and the data lines D. A plurality of second switching elements Q2 are connected to the second test gate line DC_GATE, the second test signal lines CLA, CLB, and CLC, and the data lines D.

The first crack sensing line CD1 is connected to the first data line DD1 and the second crack sensing line CD2 is connected to the second data line DD2.

The first and second crack sensing lines CD1 and CD2 are arranged on opposing sides of the pixels R, G, and B and are formed in the peripheral area adjacent to edges of the display area including the pixels R, G, and B.

The first crack sensing line CD1 is connected to the first data line DD1 through the first connection portion CP1a and the second connection portion CP1b, and the second crack sensing line CD2 is connected to the second data line DD2 through the third connection portion CP2a and the fourth connection portion CP2b.

When the first test gate line TEST_GATE is applied with the gate-on signal ON, the first switching elements Q1 connected to the data lines D are turned on such that the first signal V1 applied to the first test signal line TEST_DATA1 is applied to the data lines D. By applying the first signal V1 to the data lines D, the pixels R, G, and B display a white image.

After the first test gate line TEST_GATE is applied with the gate-off signal OFF and the second test gate line DC_GATE is applied with the gate-on signal ON, the second switching elements Q2 connected to the data lines D are turned on such that the second signal V2 applied to the second test signal lines CLA, CLB, and CLC is applied to the data lines D. By applying the second signal V2 to the data lines D, the pixels R, G, and B display a black image.

In this embodiment, when a crack is formed in the peripheral area adjacent to the edge of the display area, the damage is applied to the first and/or second crack sensing lines CD1 and CD2 formed in the peripheral area adjacent to the edge of the display area. Accordingly, the resistance of the first and/or second data lines DD1 and DD2 connected to the first and second crack sensing lines CD1 and CD2 increases. Thus, the voltage V_T applied to the pixels connected to the first and/or second data lines DD1 and DD2 is not charged to the second signal V2 and the voltage difference ΔV for the second signal V2 is generated.

Due to the voltage difference ΔV, the pixels connected to the first and/or second data lines DD1 and DD2 do not display the black image, but instead emit light having a brightness that is greater than that of the black image. Accordingly, cracks that are generated in the peripheral area adjacent to the edge of the display area can be sensed.

The first and second crack sensing lines CD1 and CD2 of the display device according to an exemplary embodiment include a third oblique portion CC1 forming a first angle θ1 with the direction DR in which the data line extends and a fourth oblique portion CC2 forming a second angle θ2 with the direction DR. The third and fourth oblique portions CC1 and CC2 are connected to each other in the third crossing portion d3.

The third and fourth oblique portions CC1 and CC2 have a relatively wide width, and the third crossing portion d3 has a relatively narrow width.

Additionally, a plurality of third holes e3 are formed on the sides of the first and second crack sensing lines CD1 and CD2. The third holes e3 are formed in the insulating layer formed under and/or over the first and second crack sensing lines CD1 and CD2.

When a crack is formed in the peripheral area adjacent to the edge of the display device, the probability of disconnection increases in the third crossing portion d3 where the third and fourth oblique portions CC1 and CC2 are connected to each other with respect to the standard display device.

By widening the width of the third and further oblique portions CC1 and CC2, the resistance of the first and second crack sensing lines CD1 and CD2 decreases, thereby preventing delays in the signal flowing through the first and second crack sensing lines CD1 and CD2.

Also, since the third holes e3 are formed on the sides of the first and second crack sensing lines CD1 and CD2, the thickness of the insulating layer formed on and/or under the first and second crack sensing lines CD1 and CD2 is decreased where the third holes e3 are formed. Accordingly, when a crack is formed in the peripheral area adjacent to the edge of the display device, the first and second crack sensing lines CD1 and CD2 the crack can traverse through the area where the third hole e3 is formed, thereby the first crack sensing line CD1 and the second crack sensing line CD2 can be easily cut, for example, open circuited.

Thus, the display device according to at least one exemplary embodiment includes the crack sensing line which includes the third and fourth oblique portions CC1 and CC2 extending in different directions and which are connected to each other at the third crossing portion d3. Thus, by decreasing the width of the third crossing portion d3, and by forming the third hole e3 on the sides of the first and second crack sensing lines CD1 and CD2, when a crack is formed in the peripheral area adjacent to the edge of the display area, the crack sensing line is easily disconnected. Accordingly, the crack of the display device can be sensed, thereby preventing the failure of the display device due to the crack.

Many characteristics of the display device according to the exemplary embodiment described with reference to FIG. 1 to FIG. 3 can be applied to the display device according to the present exemplary embodiment.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a substrate including a display area and a peripheral area neighboring the display area;
a plurality of pixels formed over the substrate in the display area; and
a plurality of signal lines formed over the substrate and connected to the pixels, wherein the signal lines include:
a plurality of data lines formed over the substrate,
a first crack sensing line formed in the peripheral area and connected to a first data line of the plurality of data lines, and
a second crack sensing line formed in the peripheral area and connected to a second data line of the plurality of data lines,
wherein the first crack sensing line and the second crack sensing line are not connected to each other and the first crack sensing line is disposed on an opposing side of the display area from the second crack sensing line,
wherein each or the first and second crack sensing lines has a substantially square wave pattern.

2. The display device of claim 1, wherein each of the first and second crack sensing lines have a substantially closed loop shape that is folded back upon itself such that the substantially square wave pattern of a first half of the first and second crack sensing lines engages with the substantially square wave pattern of a second half of the first and second crack sensing lines, respectively.

3. The display device of claim 2, further comprising a plurality of holes formed in an insulating layer that overlaps the first crack sensing line, wherein the substantially square wave pattern of the first and second crack sensing lines snake around at least some of the plurality of holes.

4. The display device of claim 1, wherein:
the signal lines further include a first test signal line and a second test signal line formed over the substrate in the peripheral area,
the first crack sensing line is connected to the first data line through a first connection portion and a second connection portion,
the first crack sensing line forms a loop between the first and second connection portions, and
the data lines are connected to: i) the first test signal line through a plurality of first switching elements and ii) the second test signal line through a plurality of second switching elements.

5. The display device of claim 4, wherein the first crack sensing line is connected between the second test signal line and the second switching elements.

6. The display device of claim 5, further comprising a first test gate line connected to the first switching elements and a second test gate line connected to the second switching elements, and wherein the first test gate line is formed in the peripheral area.

7. The display device of claim 6, wherein:
the data lines are configured to receive a first test signal from the first test signal line in response to the first test gate line being applied with a first gate-on voltage, and
the data lines are further configured to receive a second test signal from the second test signal line in response to the second test gate line being applied with a second gate-on voltage.

8. The display device of claim 7, wherein the second test gate line is further configured to receive the second gate-on voltage after the first test gate line receives the first gate-on voltage, and wherein the magnitude of the first test voltage and the magnitude of the second test voltage are different from each other.

9. A display device, comprising:
a substrate including a display area and a peripheral area neighboring the display area;
a plurality of pixels formed over the substrate in the display area; and
a plurality of signal lines formed over the substrate and connected to the pixels,
wherein the signal lines include:
a plurality of data lines formed over the substrate,
a first crack sensing line formed in the peripheral area and connected to a first data line, and
a second crack sensing line formed in the peripheral area and connected to a second data line,
wherein each of the first and second crack sensing lines have a substantially closed loop shape that folded back upon itself such that a first half and second crack sensing lines engages with a second half of the first and second crack sensing lines, respectively.

* * * * *